United States Patent
Bock et al.

(10) Patent No.: US 8,673,821 B2
(45) Date of Patent: Mar. 18, 2014

(54) COATED CONDUCTOR WITH IMPROVED GRAIN ORIENTATION

(75) Inventors: Joachim Bock, Erftstadt (DE); Jürgen Ehrenberg, Huerth (DE); Mark O. Rikel, Huerth (DE)

(73) Assignee: Nexans, Paris (FR)

( * ) Notice: Subject to any disclaimer, the term of this patent is extended or adjusted under 35 U.S.C. 154(b) by 0 days.

(21) Appl. No.: 12/979,335

(22) Filed: Dec. 28, 2010

(65) Prior Publication Data

US 2011/0312501 A1      Dec. 22, 2011

(30) Foreign Application Priority Data

Jan. 7, 2010 (EP) ..................................... 10150255

(51) Int. Cl.
*H01L 39/24* (2006.01)

(52) U.S. Cl.
USPC ............................ 505/434; 505/446; 505/447

(58) Field of Classification Search
USPC .......... 428/701, 702, 930; 505/237, 238, 434, 505/445, 446, 470; 427/62, 126.1, 126.2, 427/126.3, 379, 380, 419.3
See application file for complete search history.

(56) References Cited

U.S. PATENT DOCUMENTS

| | | | |
|---|---|---|---|
| 7,662,749 B2 * | 2/2010 | Hasegawa et al. ............ | 505/237 |
| 7,683,010 B2 * | 3/2010 | Paranthaman et al. ....... | 505/237 |
| 2004/0157747 A1 * | 8/2004 | Chen et al. .................... | 505/238 |
| 2007/0026247 A1 * | 2/2007 | Paranthaman et al. ....... | 428/469 |
| 2007/0184986 A1 * | 8/2007 | Aoki et al. .................... | 505/190 |
| 2007/0197045 A1 * | 8/2007 | Backer et al. ................. | 438/758 |
| 2007/0197397 A1 * | 8/2007 | Backer et al. ................. | 505/430 |
| 2009/0069187 A1 * | 3/2009 | Hasegawa et al. ............ | 505/230 |
| 2010/0099573 A1 * | 4/2010 | Aoki et al. .................... | 505/230 |
| 2011/0263433 A1 * | 10/2011 | Baecker et al. ............... | 505/237 |

FOREIGN PATENT DOCUMENTS

WO     WO 2009/121321 A1  *  10/2009

OTHER PUBLICATIONS

King et al. "The Progress Made Using the Combustion Chemical Vapor Deposition (CCVD) Technique to Fabricate YBCO Coated oOnductors" Jun. 2003, IEE Transactions on Applied SUperconductivity, vol. 13, No. 2, pp. 2643-2645.*
Paranthaman et al. "All MOD buffer/YBCO approach to coated conductors" Jul. 2006, Physica C 445-448 (2006) pp. 529-532.*
Paranthaman et al. "Improved YBCO Coated Conductors Using Alternate Buffer Architectures" Jun. 2005, IEEE Transaction on Applied Superconductivity, vol. 15, No. 2, pp. 2632-2634.*
Thiele et al., "Grain boundaries in YBa2Cu3O7-b films grown on bicrystalline Ni substrates" Physica C 355 (2001), pp. 203-210.*

* cited by examiner

*Primary Examiner* — Colleen Dunn
(74) *Attorney, Agent, or Firm* — Sofer & Haroun, LLP

(57) ABSTRACT

A coated conductor comprising an improved buffer layer architecture where the buffer layers are obtainable by chemical solution deposition and where the buffer layers essentially adopt the degree of texture of the substrate.

8 Claims, 1 Drawing Sheet

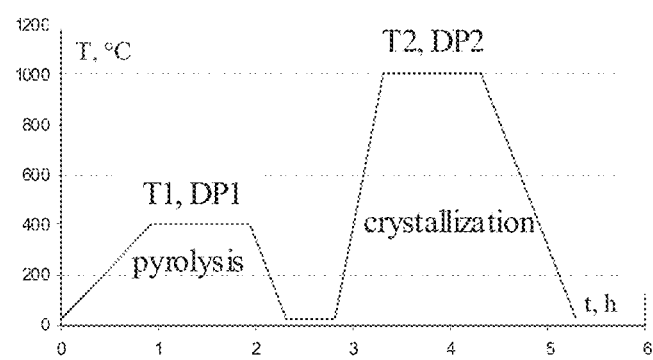

COATED CONDUCTOR WITH IMPROVED GRAIN ORIENTATION

RELATED APPLICATION

This application claims the benefit of priority from European Patent No. 10 150 255.7, filed on Jan. 7, 2010, the entirety which is incorporated by reference.

BACKGROUND

1. Field of the Invention

The present invention relates to a high temperature superconductor (HTS), in particular to a high temperature superconductor known as coated conductor as well as to a process for the production of a coated conductor resulting in improved orientation of the superconductor layer.

2. Description of Related Art

Coated conductors, which are also referred to as "second generation superconductors", are useful in the production of long lengths flexible HTS tapes or wires. They are composed of a multilayer structure with a substrate, a superconductor layer and, typically, one or more buffer layer(s) between the substrate and the superconductor layer. The buffer layer(s) serve to compensate for the various different properties of the materials used. Finally, onto the superconductor layer, according to need, further layers such as metallic protection layer, may be deposited to complete the whole conductor structure.

High temperature superconductors, such as coated conductors, are promising candidates for a plurality of applications for power transmission cables, rotor coils of motors and generators, and windings of transformers, fault current limiters as well as of magnets, for example, for medical magnetic resonance imaging (MRI).

Though not restricted thereto, currently, the rare earth barium cuprate-type superconductors of the general formula $REBa_2Cu_3O_{7-x}$ (REBCO) are conventionally used in the production of coated conductors. A particular member thereof is that one known by reference YBCO-123 wherein the numerical combination 123 stands for the stoichiometric ratio of the metals Y, Ba and Cu.

A major problem in the production of coated conductors is the crystallographic orientation of the crystal grains of the superconductor material. In order to have good superconducting performance, for example in terms of critical current density (Jc) and critical current (Ic), the superconductor material must have a high degree of orientation or texture with the individual crystal grains being oriented essentially in parallel to each other and with an inclination against each other as small as possible.

The term "texture" relates to the distribution of crystallographic orientations of the crystal grains of a polycrystalline sample. A sample in which these orientations are fully random is said to have no texture.

Preferably, the superconductor layer has a biaxial texture with the crystal grains being aligned both in the same direction with respect to the surface plane (in-plane or a-b alignment) and perpendicular to the plane (out-of-plane or c-axis alignment).

The necessity of biaxial texture of high temperature superconductors stems from the fact that the grain boundaries strongly suppress or even block the critical current flow in the high temperature superconductor materials. The achievement of a high, almost single-crystalline perfection of the layers in long lengths, such as of kilometer lengths, as required for example, in cable production, is a major challenge in the production of coated conductors.

For the deposition of the buffer layers several techniques are known. These can generally be divided into two categories: vapor deposition techniques, such as vacuum techniques, and chemical solution deposition (CSD) techniques.

The principal difference is that in the vacuum techniques the material is supplied to the surface of the growing layer in atomic portions and the quality of the layer to be formed can be rather well controlled. In particular, the biaxial texture can be even induced during vacuum deposition as is the case of such a method as ion-beam-assisted deposition (IBAD) or inclined substrate deposition (ISD). For almost all vacuum techniques such as pulsed laser deposition (PLD), metal organic chemical vapor deposition (MOCVD), reactive sputtering, etc. suitable condition for texture improvement during deposition can be found rather easily. However, these deposition techniques require vacuum equipment which is expensive. Further, these methods are often limited by deposition rate and compositional control as well as of high costs of precursor materials.

A. C. King et al "The progress made using the combustion chemical vapor deposition (CCVD) technique to fabricate $YBa_2Cu_3O_{7-x}$ coated conductors", IEEE transactions on applied superconductivity, vol. 13, no. 2, June 2003 is directed to an non vacuum chemical vapor deposition technique in the production of coated conductor wherein the buffer layers are deposited by combustion chemical vapor deposition (CCVD). Disclosed is a layer architecture for a coated conductor comprising a biaxially textured metal substrate, a ceria ($CeO_2$) seed layer and a lanthanum zirconate (LZO) buffer layer deposited thereon, wherein both the $CeO_2$ and LZO layer are each obtained by combustion chemical vapor deposition.

CCVD is a true vapor deposition process, wherein the substrate is coated by drawing it over a flame plasma obtained from vaporization of the precursors dissolved in a solvent. In CCVD the vaporized precursors need activation in a combustion flame before they reach the substrate surface. In this process the precursor solvent requires vaporization, activation and coating by drawing the substrate through the flame plasma. Furthermore, it is stated that in case of buffer layer deposition, a localized reducing atmosphere is used to prevent oxidation of the substrate metal which requires seals for allowing continued substrate passage between the open air and the localized reducing atmosphere. The locally reducing atmosphere is also necessary in the deposition of YBCO to minimize oxidation of the buffered substrates. Though vacuum technique can be avoided a complex apparatus is needed in view of the above requirements.

In the CSD technology a metal organic (MO) precursor layer of finite thickness is first deposited on a textured metallic substrate. After decomposition of the organic components in the layer, the compound of interest then grows in an usually amorphous matrix. In CSD orientation of layers is achieved by epitaxial growth onto a textured template. That is, a suitably textured substrate serves as a template for inducing the desired orientation in the layer to be grown. Similar, each further layer adopt the crystal orientation of the underlying layer onto which said further layer is grown.

A typical example of a CSD technique is referred to metal organic deposition or decomposition (MOD) and modifications thereof such as the sol-gel process or YBCO trifluoroacetate (TFA) process.

Chemical solution deposition does not require vacuum equipment. Further, the precursors used in chemical solution deposition are comparatively cheap. Thus, deposition of all the buffer layers required in the production of coated conductors and, preferably, inclusive deposition of the HTS layer by chemical solution deposition offer a low cost process suitable for commercial application. The principal difficulty for implementing this all-CSD technology is the fact, that the texture of the layer grown is usually not better than that of the substrate.

With the CSD technology highly oriented layers can be obtained when grown on single crystal substrates, which possess a high texture by nature. However, single crystals are very expensive and, further, are not available in the large area and long length as required for cable or wire application.

There are known textured substrates which are obtained by mechanical deformation of metal tapes followed by recrystallization annealing. A typical example of such textured metallic substrates is known as RABiTS (rolling assisted biaxially textured substrate). On such textured metal substrates buffer layers with suitable texture can be grown, which, in turn, can serve as template for transferring the desired texture to a superconductor layer to be grown on the buffer layer.

However, RABIT substrates currently available on the market are polycrystalline with a degree of misorientation of the grains which cannot be neglected. Moreover, when using CSD techniques the texture of the layer to be grown is often worse than that of the underlying template such as the substrate. For example, in the particular case of $La_2Zr_2O_7$ (LZO) buffers, the out-of-plane texture is usually 15 to 30% inferior than that of the underlying Ni—W alloy RABITS. If such misorientation of the grain boundaries is transferred to the HTS layer to be grown, many grain boundaries in the final HTS layer are not transparent to the supercurrent.

Degradation of texture may make the network of such "bad" grain boundaries in the final HTS layer almost close to the percolation limit when the probability of the current breaking paths along the tape width becomes close to 100%.

Currently, this problem is circumvented by coated conductor manufacturers that utilize a CSD (MOD-TFA)-technique for depositing the HTS layer, by depositing all or some buffer layers via vacuum techniques, so that the texture of the buffer layers is not deteriorated or can be even improved compared to the metallic substrate.

However in view of costs, there is the desire for a buffer layer architecture using biaxially textured substrates and which is fully obtainable by CSD techniques (all-CSD).

OBJECTS AND SUMMARY

In view of the above it was the object of the present invention to find a buffer layer architecture which can be obtained by all-CSD technique wherein the texture of the substrate tape is essentially transferred to a high temperature superconductor layer to be deposited onto the buffer layer architecture. According to the present invention a buffer layer arrangement is provided wherein the quality of texture of the buffer layers is similar to the quality of the texture of the substrate.

According to the present invention this problem is solved by providing a layer architecture for a coated conductor composed of a biaxially textured metal substrate, a seed layer having the general formula $(Ce_{1-y}Gd_y)O_{2-\delta}$ (CGO) with $0 \leq y \leq 0.4$ and $\delta$ standing for the balance of oxygen, which is deposited onto the substrate, and a buffer layer having the general formula $La_{2+z}Zr_{2-z}O_{7-z/2}$ (LZO), with $-0.25 \leq z \leq 0.64$ being deposited onto the CGO layer, wherein both the CGO layer and the LZO layer are obtainable by chemical solution deposition.

It was found that when using the specific layer architecture of the present invention the texture of the substrate can be conserved by the fully epitaxial buffer layers without any remarkable degradation. Consequently, the texture of the substrate can be transferred to the HTS layer to be grown.

For the present invention commercially available biaxially textured metal substrates can be used. Examples of metals suitable for that substrates are copper, nickel, silver, iron and alloys thereof, in particular alloys of Ni and Cu, respectively. A well known example of such biaxially textured substrates are the above referred RABiTS. Processes for obtaining such biaxially textured metal substrates are well known. Typically, the metal tapes are mechanically deformed, for example rolled, and, then heat treated for re-crystallization in the desired biaxial texture. By these processes biaxially textured substrates of long lengths can be obtained with comparatively economic costs. As set out above, the problem with such biaxially textured metal substrates is, that the texture shows an appreciable degree of misorientation.

For the deposition of the buffer layers as well as of the HTS layer preferably a metal organic deposition (MOD) technique is used. The MOD process is ideally suited for the rapid and inexpensive deposition of ceramic films on large or continuous substrates. Use of MOD techniques for the deposition of buffer layers and HTS layers in the production of coated conductors is well known and there exists a comprehensive literature related thereto.

Typically in MOD processes an organic precursor compound of the respective metal is dissolved in a solvent and the precursor solution is coated onto the surface of an underlying layer (substrate, buffer layer, HTS layer etc.). The film is then transformed to the desired final layer by heat treatment, wherein the heat treatment can include more than one distinct heating step. In case of layers composed of more than one metal, such as $La_{2+z}Zr_{2-z}O_{7-z/2}$, the precursor solution comprises the respective metals in the metal ratio of the final layer, for example 2+z:2−z for LZO or 1−y:y for $(Ce_{1-y}Gd_y)O_{2-\delta}$.

Suitable metal organic precursor compounds are the acetylacetonates (acac) or other β-diketonates, alkoxides or acetates of the respective metals.

The resulting precursor solution can be coated by any suitable coating technique such as dip coating or slot coating.

According to the present invention the first layer to be coated onto the substrate has the general formula $(Ce_{1-y}Gd_y)O_{2-\delta}$ with y being $0 \leq y \leq 0.4$. In the formula "δ" stands for the balance of oxygen, which varies depending on the amount of Gd present. Preferably the seed layer comprises Gd, (that is $y \neq 0$) and more preferably y is in the range of from 0.1 to 0.2.

Onto the CGO seed layer LZO is deposited as second buffer layer. It is also possible to replace in LZO La partially or completely by one or more other rare earth element such as Sc, Y, Ce, Pr, Nd, Sm, Eu, Gd, Tb, Dy, Ho, Er, Tm, Yb and Lu, and/or Zr partially or completely by one of more of Ti or Hf. The second buffer layer as defined above is also referred to "further layer".

By using the CGO seed layer of the present invention it is possible to deposit the next LZO layer with a better texture than without the CGO layer. That is, the CGO seed layer of the present invention serves to conserve the texture of the substrate and, further, to transfer this texture to the subsequent LZO layer.

Typically, in the present invention, the thickness of the seed layer is in the range of from 20 to 50 nm and that of the LZO layer in the range of from 50 to 200 nm.

The HTS layer can be any of $REBa_2Cu_3O_{7-x}$, wherein RE means at least one rare earth element. Such as Y, La, Ce, Pr, Nd, Pm, Sm, Eu, Gd, Tb, Dy, Ho, Er, Tm, Yb and Lu, and x means a value sufficient to impart superconductivity to the final HTS layer. Preferably RE is Y.

In principle, for the deposition of the HTS layer any method known for the deposition of HTS layers can be used. Suitable methods are metal organic chemical vapor deposition (MOCVD), physical vapor deposition (PVD) such as e-beam deposition or pulsed laser deposition and hybrid liquid phase epitaxy (HLPE).

Also chemical solution deposition can be used such as MOD and modifications thereof such as sol-gel and trifluoroacetate (TFA) methods.

According to need one or more further buffer layers can be deposited onto the LZO buffer layer prior to the deposition of the HTS layer. However, when depositing such "intermediate" buffer layers care should be taken that the texture of the intermediate layers and of the HTS layer are not degraded to such extent that the HTS layer is no longer usable.

An example for a suitable intermediate layer is a layer of CGO.

In particular, if the HTS layer is deposited via TFA method additional deposition of an intermediate CGO layer is preferable for suppressing any reaction of Fluorine present in the trifluoroacetate and LZO upon heating.

The freshly deposited films are converted to the final buffer layer by heat treatment usually at temperatures between 200° C. and 500° C. to remove major organic constituents (pyrolysis) and to form an amorphous or nanocrystalline layer and then at 800 to 1200° C. to form polycrystalline epitaxial layer (crystallization).

The heat treatment is carried out in the presence of a processing gas having a defined humidity. A suitable processing gas is an inert gas such as argon (Ar) which can comprise some hydrogen ($H_2$) to suppress oxidation of metallic substrate.

In the preparation of the present buffer layer architecture the heat treatment of the CGO seed layer at least at the first (pyrolysis) stage is carried out under higher humidity (more oxidizing) conditions than for the subsequent LZO layer. It has been observed that under such conditions a highly epitaxial CGO seed layer can be obtained conserving the texture of the underlying textured substrate.

The oxidizing conditions can be controlled by the degree of humidity of the processing gas. Humidity refers to the water vapor content in the processing gas. The humidity is defined herein in terms of the dew point. The dew point is the temperature at which water vapor present in an atmosphere starts to condense. The higher the dew point, the more water vapor is present in the atmosphere. Further, the more water vapor is present in the processing gas the more oxidizing are the conditions.

Consequently, the dew point of the processing gas used at least at the first stage of the heat treatment of CGO is higher than the dew point of the processing gas in the heat treatment of LZO.

BRIEF DESCRIPTION OF DRAWINGS

FIG. 1—is a graph showing temperature vs. holding time of a tape sample according to one embodiment, subjected to a two step heat treatment.

DETAILED DESCRIPTION

The present invention is further described by way of the following examples which are for the purpose of illustration only and are in no way intended to be limiting of the invention.

According to the present invention the buffer layers are all obtainable by simple chemical solution techniques such as metal organic deposition. Further, the present invention is advantageous in that the CGO seed layer can conserve the texture of the substrate, and, further, transfers this texture to the subsequent LZO buffer layer.

That is the present invention provides, on one side, a coated conductor wherein the buffer layers are all obtainable by chemical solution deposition process and, further, on the other side, in addition to an "all CSD process" a high performance coated conductor with improved texture quality.

Generally, layers obtained by chemical solution deposition such as metal organic deposition can be easily identified and distinguished from layers obtained by other techniques such as by vapor deposition techniques, for example physical or chemical vapor deposition and CCVD in view of microstructure such as for example grain size, porosity, defects and density by using, for example, well known standard techniques such as transmission electron microscopy (TEM), which is standard for coated conductors. That is, deposition technique influences the microstructure of the layer obtained and, thus, layers obtained by different techniques can be readily distinguished from each other by standard methods.

EXAMPLE

Production Of Layer Architecture LZO/CGO/NiW

A Ni-5% W RABIT substrate was used. Metal acetylacetonates (acac) for LZO (up to 0.6 M; 49±1 mol % $LaO_{1.5}$) and CGO (up to 0.6 M; 20% Gd) were dissolved in propionic acid. The respective precursor solutions were deposited onto the Ni-5% W RABIT substrates using dip coating. The tape samples with the dried freshly deposited films were subjected to a two step heat treatment in Ar-5% $H_2$ gas flow with controlled humidity in both steps of the heat treatment, the pyrolysis step (with dew point DP1) and the crystallization step (with dew point DP2).

The two step heat treatment (temperature, holding time etc.) is shown in FIG. 1.

It is also possible to use a modification of the pyrolysis step wherein also the pyrolysis step is comprised of two parts with, for example, a first annealing at T1=300° C. for 0.5 h followed by a second annealing at 400° C. for 0.5 h.

In the heat treatment of the CGO layer DP1 was above −25° C. (usually 0° C.) and DP2 was less than −35° C., whereas in the heat treatment of LZO both DP1 and DP2 were less than −35° C.

According to the above procedure two samples according of the present invention were obtained with sample 1 being composed of the substrate, the CGO seed layer and an LZO buffer layer, and sample 2 comprising additionally an intermediate CGO layer deposited onto the LZO layer.

Further, two comparative samples were obtained comprising LZO layers of different thicknesses directly deposited onto the substrate (comparative sample 1 and comparative sample 2).

The deposited layers were characterized using optical methods (reflectometry and ellipsometry) to determine the layer thickness and X-Ray diffraction to determine epitaxial and randomly oriented polycrystalline fractions. The degree of texture was determined by X-Ray diffraction specifying the in-plane and out-of-plane orientation distribution functions of the grains in the layers. Based on the X-Ray data the values of the integral breadths β of the rocking curves ($\beta=\Delta\omega$) and phi scans ($\beta=\Delta\phi$) are obtained. The smaller the respective β-values the better the texture.

Details of the determination are described in M. O. Rikel et al., Simplified procedure for estimating epitaxy of $La_2Zr_2O_7$-buffered NiW-RABITS using XRD, Applied Superconductivity, IEEE Trans, 19 (2009) pages 3307 to 3310, which is incorporated herein by reference.

The results are shown in the following tables 1 to 3 with β being integral breadths of the h00 (h=2 for NiW and CGO, and 4 for LZO) rocking curves (RC) around axes along transverse (TD) and rolling direction (RD) or hhh peaks in the phi-scans (h=1 for NiW and CGO, and 2 for LZO); d=layer thickness; EF=epitaxial fraction; ROF=randomly oriented fraction.

The respective results of comparative samples 1 and 2 are shown in table 1, of sample 1 in table 2 and of sample 3 in table 3.

In the tables the epitaxy and out-of-plane texture characteristics of the respective buffer layers are shown.

| Comparative Samples | d, nm | EF, % | Error EF+/- | ROF, % | Error ROF+/- | RC(TD) β | Error+/- | RC(RD) β | Error+/- |
|---|---|---|---|---|---|---|---|---|---|
| 1 | 121 | 96 | 7 | 7 | 2 | 6.5 | 0.2 | 10.9 | 0.3 |
| 2 | 78 | 80 | 7 | 8 | 5 | 6.6 | 0.2 | 9.9 | 0.3 |
| NiW | 76000 | 87 | 6 | 0 | 0 | 5.4 | 0.0 | 8.3 | 0.0 |

| Sample 1 | d, nm | EF, % | Error EF+/- | ROF, % | Error ROF+/- | RC(TD) β | Error+/- | RC(RD) β | Error+/- |
|---|---|---|---|---|---|---|---|---|---|
| LZO | 75 | 94 | 7 | 6 | 3 | 5.4 | 0.1 | 8.6 | 0.2 |
| CGO | 47 | 88 | 8 | 3 | 3 | 5.3 | 0.2 | 8.4 | 0.3 |
| NiW | 76000 | 87 | 6 | 0 | 0 | 5.4 | 0.0 | 8.3 | 0.0 |

| Sample 2 | d, nm | EF, % | Error EF+/- | RC(TD) β | Error+/- | RC(RD) β | Error+/- | Phi β | Error+/- |
|---|---|---|---|---|---|---|---|---|---|
| CGO-2 | 35.0 | 95 | 12 | 5.5 | 0.1 | 8.7 | 0.2 | 6.4 | 0.3 |
| LZO | 147.0 | 87 | 8 | 5.4 | 0.1 | 8.5 | 0.2 | 6.2 | 0.3 |
| CGO-1 | 43.0 | 98 | 8 | 5.4 | 0.2 | 8.2 | 0.3 | n.m | n.m |
| NiW | 76000 | n.m | n.m | 5.3 | 0.0 | 8.4 | 0.2 | 6.5 | 0.1 |

(n.m = not measured)

By the specific layer architecture of the present invention almost 100% epitaxial CGO and LZO buffer layers can be obtained having a texture quality which equals to the texture quality of the substrate whereas in comparative samples 1 and 2 the texture of the LZO buffer layers show a significant degradation compared to the texture quality of the substrate.

Further, as shown by the results of table 3, a further CGO layer can be deposited onto the LZO buffer layer as a cap layer wherein the cap CGO layer adopts almost the same out-of-plane and in-plane texture of the underlying LZO layer.

It is assumed that better out-of-plane texture of the uppermost buffer layer can provide better performance and guarantee higher stability of the deposition techniques used for depositing the HTS layer such as YBCO-123.

The invention claimed is:

1. Process for the preparation of the layer architecture for a coated conductor comprising a seed layer and a further layer by metal organic deposition, said process comprising the following steps:

coating onto a biaxialy textured metal substrate, a precursor solution via metal organic deposition (MOD), for the formation of a seed layer of general formula $(Ce_{1-y}GD_y)O_{2-\delta}$ with $0 \leq y \leq 0.4$ and δ standing for the balance of oxygen, subjecting the freshly coated seed later to a heat treatment comprising heating to a first temperature for pyrolysis and heating to a second temperature for crystallization, wherein the pyrolysis is carried out under a first more oxidizing condition than a second oxidizing condition for the crystallization, wherein the first temperature for pyrolysis is lower than the second temperature for crystallization, and coating onto the seed layer a precursor solution for forming a further layer of general formula $La_{2+z}Zr_{2-z}O_{7-z/2}$ where either one of z is $-0.25 \leq z \leq 0.64$, or La is either one of partially or completely replaced by one or more other rare earth (RE) elements selected from the group consisting of Sc, Y, Ce, Pr, Nd, Sm, Eu, Gd, Tb, Dy, Ho, Er, Tm, Yb and Lu, and wherein optionally in the further layer Zr is either one of partially or completely replaced by one or more of Ti or Hf, and subjecting the freshly coated further layer to a heat treatment wherein the heat treatment of the freshly coated further layer is carried out at a third less oxidizing condition than said first oxidizing condition of said pyrolysis step of the heat treatment of the freshly deposited seed layer.

2. Process according to claim 1 wherein onto the further layer, a layer is deposited having the general formula $(Ce_{1-y}Gd_y)O_{2-\delta}$, with y being $0 \leq y \leq 0.4$ and δ standing for the balance of oxygen, by metal organic deposition process.

3. Process according to claim 1, wherein y is in the range of from 0.1 to 0.2.

4. Process according to claim 1, wherein each of said first, second and third oxidizing conditions are controlled by the humidity present during heat treatment.

5. The process according to claim 1, said process further comprising the step of:

depositing a high temperature superconductor layer onto said further layer.

6. Process according to claim 1, wherein the seed layer has a thickness in the range of 20 to 50 μm.

7. Process according to claim 1, wherein in the first step pyrolysis is carried out at a temperature between 200° C. and 500° C. and crystallization at a temperature between 800° C. and 1200° C.

8. The process according to claim 5, said process further comprising the step of:

depositing one or more additional buffer layers between said high temperature superconductor layer and said further layer.

\* \* \* \* \*